(12) United States Patent
Yamaguchi et al.

(10) Patent No.: US 11,289,408 B2
(45) Date of Patent: Mar. 29, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kakeru Yamaguchi, Yokohama (JP); Jun Karasawa, Shinagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/018,654

(22) Filed: Sep. 11, 2020

(65) Prior Publication Data
US 2021/0090976 A1 Mar. 25, 2021

(30) Foreign Application Priority Data
Sep. 20, 2019 (JP) .............................. JP2019-171824

(51) Int. Cl.
*H01L 23/495* (2006.01)
(52) U.S. Cl.
CPC .. *H01L 23/49524* (2013.01); *H01L 23/49537* (2013.01); *H01L 23/49562* (2013.01)
(58) Field of Classification Search
CPC ......... H01L 23/49524; H01L 23/49537; H01L 23/49562
See application file for complete search history.

(56) References Cited

U.S. PATENT DOCUMENTS

| | | | | |
|---|---|---|---|---|
| 10,204,844 | B1* | 2/2019 | Tan ......................... | H01L 24/37 |
| 2008/0054438 | A1* | 3/2008 | Germain ............. | H01L 23/4334 |
| | | | | 257/690 |
| 2009/0121330 | A1* | 5/2009 | Cruz .................. | H01L 23/49503 |
| | | | | 257/676 |
| 2015/0214139 | A1 | 7/2015 | Miyakawa | |
| 2019/0139873 | A1* | 5/2019 | Saito ................. | H01L 23/49503 |

FOREIGN PATENT DOCUMENTS

| | | |
|---|---|---|
| CN | 104821305 A | 8/2015 |
| CN | 109755205 A | 5/2019 |
| JP | 2005-243685 A | 9/2005 |
| JP | 2012-33756 A | 2/2012 |
| JP | 2015-142072 A | 8/2015 |

\* cited by examiner

*Primary Examiner* — Peniel M Gumedzoe
(74) *Attorney, Agent, or Firm* — Oblon, McClelland, Maier & Neustadt, L.L.P.

(57) ABSTRACT

A semiconductor device according to one embodiment includes a first leadframe, a second leadframe, a semiconductor chip, and a conductive member. The second leadframe has a first face provided with a recess and is separated from the first leadframe. The semiconductor chip is mounted on the first leadframe. The conductive member has a second face connected to the first face with a conductive adhesive, the second face provided with a protrusion housed in the recess at least partially, and the conductive member electrically connected the semiconductor chip and the second leadframe to each other. The recess and the protrusion are longer in a first direction in which the first face extends than in a second direction along the first face and orthogonal to the first direction.

8 Claims, 9 Drawing Sheets

SEMICONDUCTOR DEVICE

CROSS-REFERENCE TO RELATED APPLICATIONS

This application is based upon and claims the benefit of priority from Japanese Patent Application No. 2019-171824, filed on Sep. 20, 2019, the entire contents of which are incorporated herein by reference.

FIELD

Embodiments described herein relate generally to a semiconductor device.

BACKGROUND

Semiconductor devices have been known, which include a leadframe and a semiconductor chip provided with electrodes, in which the leadframe and the electrodes electrically connected to each other through plate-shaped connectors, for example. The electrodes and the connectors, and the leadframe and the connectors are mechanically and electrically connected to each other with a conductive adhesive such as solder.

Such a semiconductor device may be degraded in quality depending on the condition of the conductive adhesive connecting the leadframe and the connectors together, for example.

DETAILED DESCRIPTION

According to one embodiment, a semiconductor device includes a first leadframe, a second leadframe, a semiconductor chip and a conductive member. The second leadframe is spaced apart from the first leadframe, and has a first face provided with a recess. The semiconductor chip is mounted on the first leadframe. The conductive member has a second face, and electrically connects the semiconductor chip and the second leadframe to each other, the second face connected to the first face with a conductive adhesive and provided with a protrusion at least partially housed in the recess. The recess is longer in length in a first direction in which the first face extends than in a second direction along the first face and orthogonal to the first direction. The protrusion is longer in length in the first direction than in the second direction.

First Embodiment

The following describes a first embodiment with reference to FIG. 1 to FIG. 6. In the present specification, components and descriptions of the components according to embodiments may be described by a plurality of expressions. The components and the descriptions thereof are by way of example and are not limited by the expressions of this specification. The components can be identified by names different from those in the present specification. The components can be described by expressions different from the expressions of the present specification.

Figure 1:
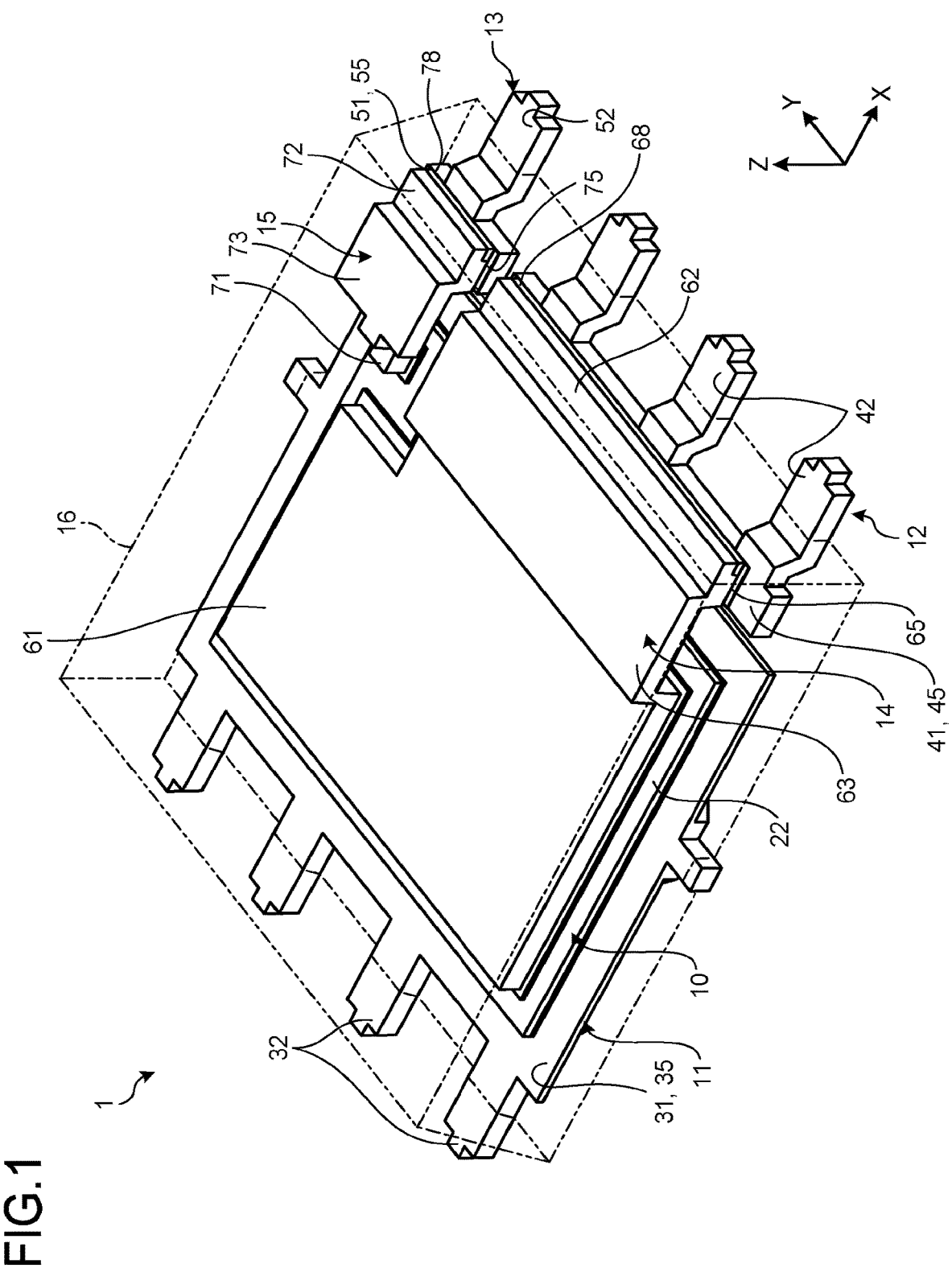
FIG. 1 is an exemplary perspective view of a semiconductor device of a first embodiment.

FIG. 1 is an exemplary perspective view of a semiconductor device 1 of the first embodiment. The semiconductor device 1 is a power device, for example. The semiconductor device 1 is not limited to this example and may be another device.

As illustrated in the drawings, in the present specification, an X axis, a Y axis, and a Z axis are defined for the sake of convenience. The X axis, the Y axis, and the Z axis are orthogonal to each other. The X axis is provided along the width of the semiconductor device 1. The Y axis is provided along the length (depth) of the semiconductor device 1. The Z axis is provided along the thickness of the semiconductor device 1.

Further, in the present specification, an X direction, a Y direction, and a Z direction are defined. The X direction is a direction along the X axis and includes a +X direction indicated by the arrow of the X axis and a −X direction as a direction opposite to the arrow of the X axis. The Y direction is a direction along the Y axis and includes a +Y direction indicated by the arrow of the Y axis and a −Y direction as a direction opposite to the arrow of the Y axis. The Z direction is a direction along the Z axis and includes a +Z direction indicated by the arrow of the Z axis and a −Z direction as a direction opposite to the arrow of the Z axis.

The semiconductor device 1 has a semiconductor chip 10, a first leadframe 11, a second leadframe 12, a third leadframe 13, a first connector 14, a second connector 15, and sealing resin 16. The first connector 14 is an exemplary conductive member. The second connector 15 can be an exemplary conductive member. FIG. 1 illustrates the sealing resin 16 in an imaginary manner with two-dotted chain lines.

The first leadframe 11 is electrically connected to the semiconductor chip 10. The second leadframe 12 is electrically connected to the semiconductor chip 10 via the first connector 14. The third leadframe 13 is electrically connected to the semiconductor chip 10 via the second connector 15. The sealing resin 16 seals the semiconductor chip 10, part of the first to the third leadframes 11 to 13, the first connector 14, and the second connector 15.

The semiconductor chip 10 is a vertical device such as a vertical metal-oxide-semiconductor field effect transistor (MOSFET), for example. The semiconductor chip 10 is not limited to this example and may be a vertical insulated gate bipolar transistor (IGBT), a vertical diode, or another semiconductor chip.

The semiconductor chip 10 contains silicon (Si) as a semiconductor. The semiconductor chip 10 is not limited to this example and may contain a compound semiconductor different from Si such as SiC or GaN, for example.

Figure 2:
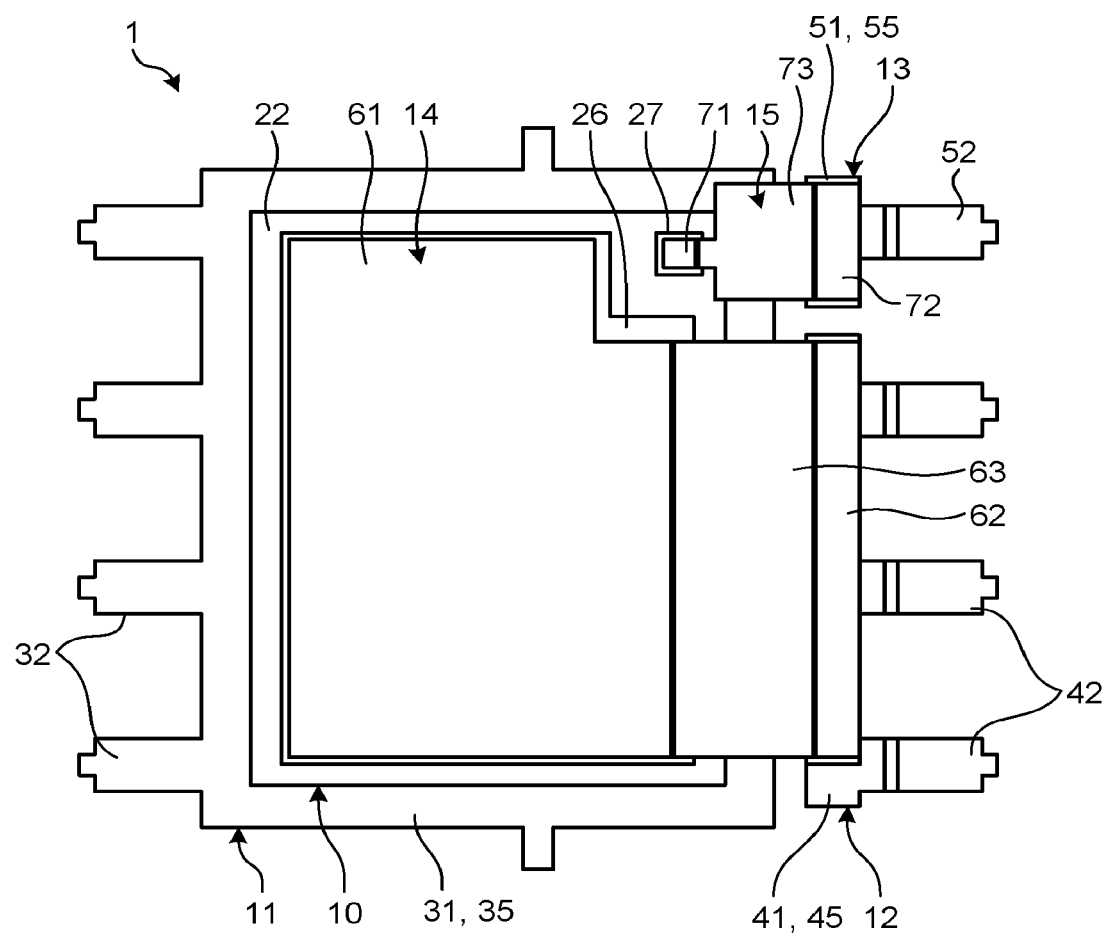
FIG. 2 is an exemplary plan view of the semiconductor device of the first embodiment with sealing resin omitted.
Figure 3:
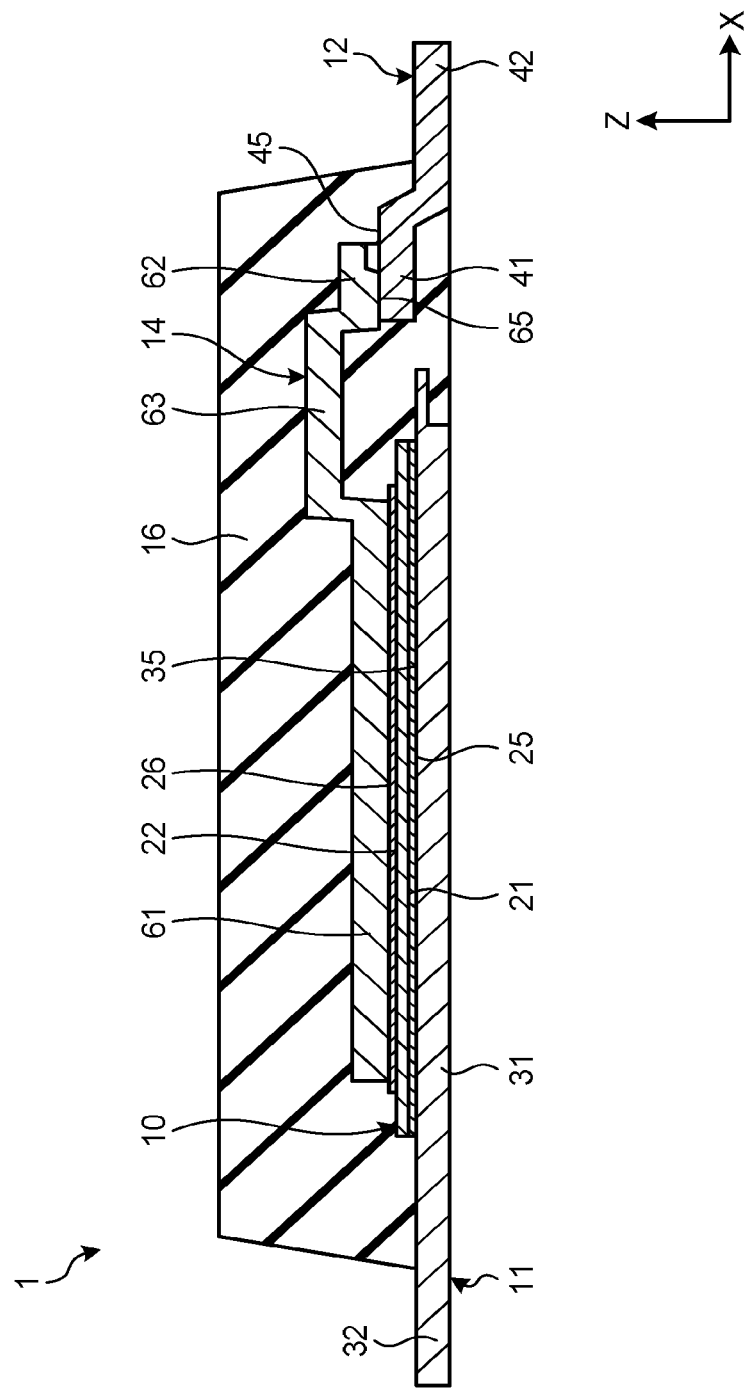
FIG. 3 is an exemplary sectional view of the semiconductor device of the first embodiment.

FIG. 2 is an exemplary plan view of the semiconductor device 1 of the first embodiment with sealing resin 16 omitted. FIG. 3 is an exemplary sectional view of the semiconductor device 1 of the first embodiment. The semiconductor chip 10 has a lower face 21, an upper face 22, a first electrode 25, and a second electrode 26 illustrated in FIG. 3 and a third electrode 27 illustrated in FIG. 2.

In the present embodiment, expressions indicating directions such as up upper and lower are expression for the sake of convenience based on FIG. 2 and FIG. 3. The expressions indicating directions do not limit the position and direction of the components in the semiconductor device 1.

As illustrated in FIG. 3, the lower face 21 is a substantially flat face directed in the −Z direction. The upper face 22 is positioned opposite to the lower face 21. The upper face 22 is a substantially flat face directed in the +Z direction. The first electrode 25 is provided on the lower face 21. The second electrode 26 and the third electrode 27 are provided on the upper face 22.

The semiconductor chip 10 is provided with an electric path connecting the first electrode 25 and the second electrode 26 and the third electrode 27 to each other. The first electrode 25 is a drain electrode, for example. The second electrode 26 is a source electrode, for example. The third electrode 27 is a gate electrode, for example. The first electrode 25 is provided on almost all the lower face 21. The second electrode 26 is smaller than the first electrode 25. The third electrode 27 is smaller than the second electrode 26.

The first to the third leadframes 11 to 13 are made of copper, for example, and have conductivity. The first to the third leadframes 11 to 13 have a plate shape, for example. The material and shape of the first to the third leadframes 11 to 13 are not limited to these examples.

As illustrated in FIG. 2, the first to the third leadframes 11 to 13 are arranged spaced apart from each other on an X-Y plane. The first to the third leadframes 11 to 13 may be arranged at different positions in the Z direction.

The first leadframe 11 has a die pad 31 and a plurality of leads 32. The first leadframe 11 is made by press working, for example. The die pad 31 and the leads 32 are integrally formed.

The die pad 31 has a substantially rectangular plate shape lying in the X-Y plane. The die pad 31 has a first connecting face 35. The first connecting face 35 is a substantially flat face directed in the +Z direction. The leads 32 extend substantially in parallel with each other from an edge of the die pad 31. The leads 32 extend in the −X direction from the die pad 31, for example.

The second leadframe 12 is separated in the +X direction from the first leadframe 11. In other words, the second leadframe 12 is separated in a direction opposite to the direction in which the leads 32 extend from the die pad 31.

The second leadframe 12 is provided with an inner lead 41 and a plurality of outer leads 42. The second leadframe 12 is formed by press working, for example. The inner lead 41 and the outer leads 42 are integrally formed.

The inner lead 41 has a substantially rectangular (quadrangular) plate shape lying in the X-Y plane. The inner lead 41 extends in the Y direction. The inner lead 41 has a second connecting face 45. The second connecting face 45 is an exemplary first face.

The second connecting face 45 is a substantially rectangular (quadrangular) substantially flat face directed in the +Z direction. That is to say, the second connecting face 45 and the first connecting face 35 are directed in substantially the same direction. The second connecting face 45 extends in the Y direction. The Y direction is a direction in which the first face extends, and is an exemplary first direction. In the present specification, a direction in which an element extends refers to, for example, a longitudinal direction of an element of a substantially rectangular form. A direction in which the second connecting face 45 extends refers to a longitudinal direction of the second connecting face 45 of a substantially rectangular form. The second connecting face 45 is longer in length in the Y direction than in the X direction.

The inner lead 41 and the second connecting face 45 may be formed into another shape such as a substantially L shape. When the inner lead 41 and the second connecting face 45 have a substantially L shape, for example, a direction in which one side thereof (a first part) extends and a direction in which another side thereof (a second part) extends are each an exemplary direction in which the first face extends.

As illustrated in FIG. 2, the outer leads 42 extend substantially in parallel with each other from an edge of the inner lead 41. The outer leads 42 extend in the +X direction from the inner lead 41, for example. That is to say, the outer leads 42 extend in a direction opposite to the leads 32.

As illustrated in FIG. 3, in the Z direction, the inner lead 41 is not aligned with the first leadframe 11 in the +Z direction. In other words, in the Z direction, the second connecting face 45 of the inner lead 41 is separated in the +Z direction from the first connecting face 35 of the first leadframe 11. Connected parts between the inner lead 41 and the outer leads 42 are bent. The outer leads 42 are provided at substantially the same position as that of the first leadframe 11 in the Z direction.

As illustrated in FIG. 2, the third leadframe 13 is separated in the +X direction from the first leadframe 11. Furthermore, the third leadframe 13 is separated in the +Y direction from the second leadframe 12. Thus, the first to the third leadframes 11 to 13 are separated from each other.

The third leadframe 13 has an inner lead 51 and an outer lead 52. The third leadframe 13 is made by press working, for example. The inner lead 51 and the outer lead 52 are integrally formed.

The inner lead 51 has a substantially rectangular (quadrangular) plate shape lying in the X-Y plane. The inner lead 51 extends in the Y direction. The inner lead 51 has a third connecting face 55. The third connecting face 55 can also be an exemplary first face.

The third connecting face 55 is a substantially rectangular (quadrangular) substantially flat face directed in the +Z direction. That is to say, the third connecting face 55 is directed in substantially the same direction as that of the first connecting face 35. The third connecting face 55 extends in the Y direction. The length of the third connecting face 55 in the Y direction is longer than the length thereof in the X direction. In the Y direction, the third connecting face 55 is shorter than the second connecting face 45.

The outer lead 52 extends in the +X direction, for example, from an edge of the inner lead 51. That is to say, the outer lead 52 extends substantially in parallel with the outer lead 42 of the second leadframe 12.

In the Z direction, the inner lead 51 is not aligned with the first leadframe 11 in the +Z direction. A connected part between the inner lead 51 and the outer lead 52 is bent. The outer lead 52 is provided at substantially the same position as that of the first leadframe 11 in the Z direction.

The semiconductor chip 10 is disposed on the die pad 31 of the first leadframe 11. As illustrated in FIG. 3, the lower face 21 of the semiconductor chip 10 and the first connecting face 35 of the die pad 31 face each other.

The first electrode 25 of the semiconductor chip 10 is mechanically and electrically connected to the first connecting face 35 of the die pad 31 with a conductive adhesive such as solder. Thus, the semiconductor chip 10 is mounted on the first leadframe 11.

The first and the second connectors 14 and 15 are made of copper, for example, and have conductivity. The first and the second connectors 14 and 15 have a plate shape, for example. Each of the first and the second connectors 14 and 15 is thicker than each of the first to the third leadframes 11 to 13. The material and shape of the first and the second connectors 14 and 15 are not limited to these examples.

The first connector 14 has a first connecting part 61, a second connecting part 62, and an intermediate part 63. The first connector 14 is formed by press working, for example. The first connecting part 61, the second connecting part 62, and the intermediate part 63 are integrally formed.

The second connecting part 62 is separated in the +X direction from the first connecting part 61. The intermediate part 63 connects the first connecting part 61 and the second connecting part 62 to each other. In the Z direction, the second connecting part 62 is separated in the +Z direction from the first connecting part 61. The intermediate part 63 is bent so as to have a part that is separated in the +Z direction further from the first connecting part 61 than from the second connecting part 62.

The first connecting part 61 is disposed on the second electrode 26 of the semiconductor chip 10. The first connecting part 61 is mechanically and electrically connected to the second electrode 26 of the semiconductor chip 10 with a conductive adhesive such as solder.

The second connecting part 62 has a substantially rectangular (quadrangular) plate shape lying in the X-Y plane. The second connecting part 62 extends in the Y direction. That is to say, the second connecting part 62 extends substantially in parallel with the inner lead 41 of the second leadframe 12.

Figure 4:
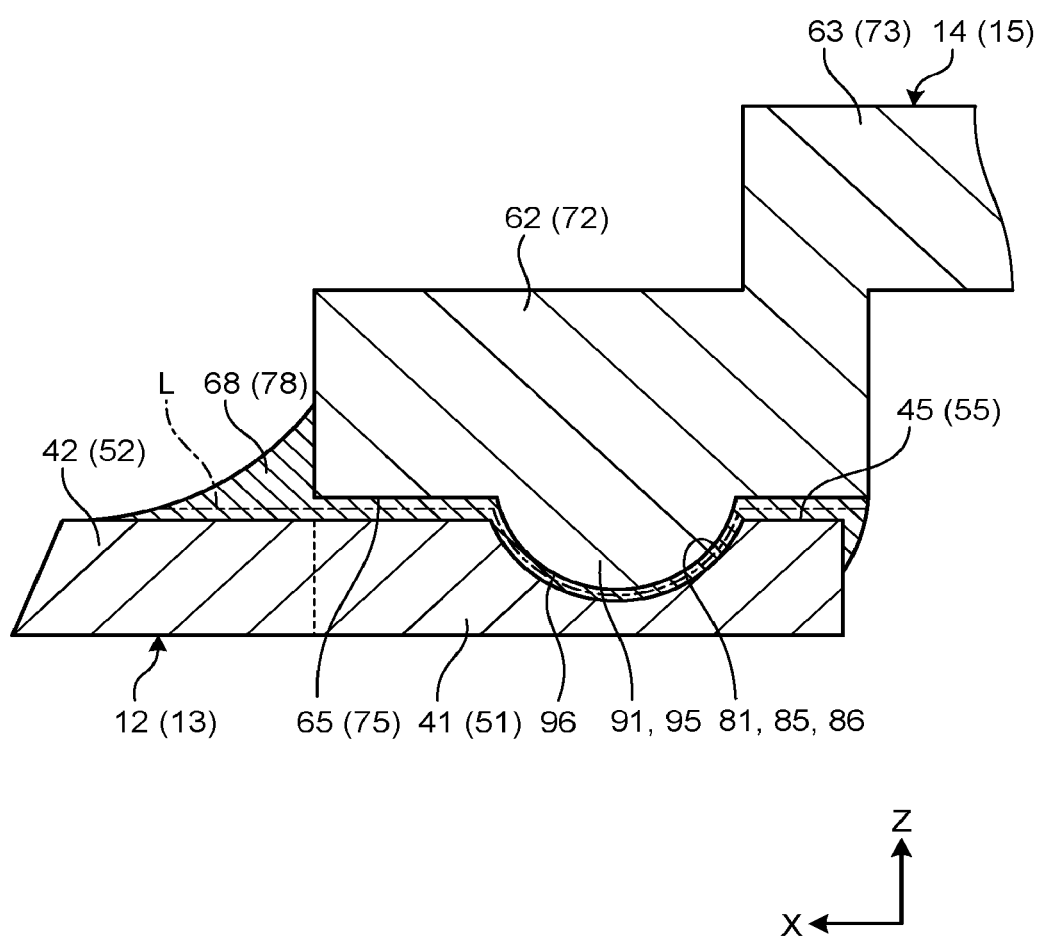
FIG. 4 is an exemplary schematic sectional view of a second leadframe and part of a first connector of the first embodiment.

FIG. 4 is an exemplary schematic sectional view of the second leadframe 12 and part of the first connector 14 of the first embodiment. As illustrated in FIG. 4, the second connecting part 62 has a fourth connecting face 65. The fourth connecting face 65 is an exemplary second face. The fourth connecting face 65 is a substantially rectangular (quadrangular) substantially flat face directed in the −Z direction. That is to say, the fourth connecting face 65 is directed in a direction opposite to the direction to which the second connecting face 45 is directed.

Figure 5:
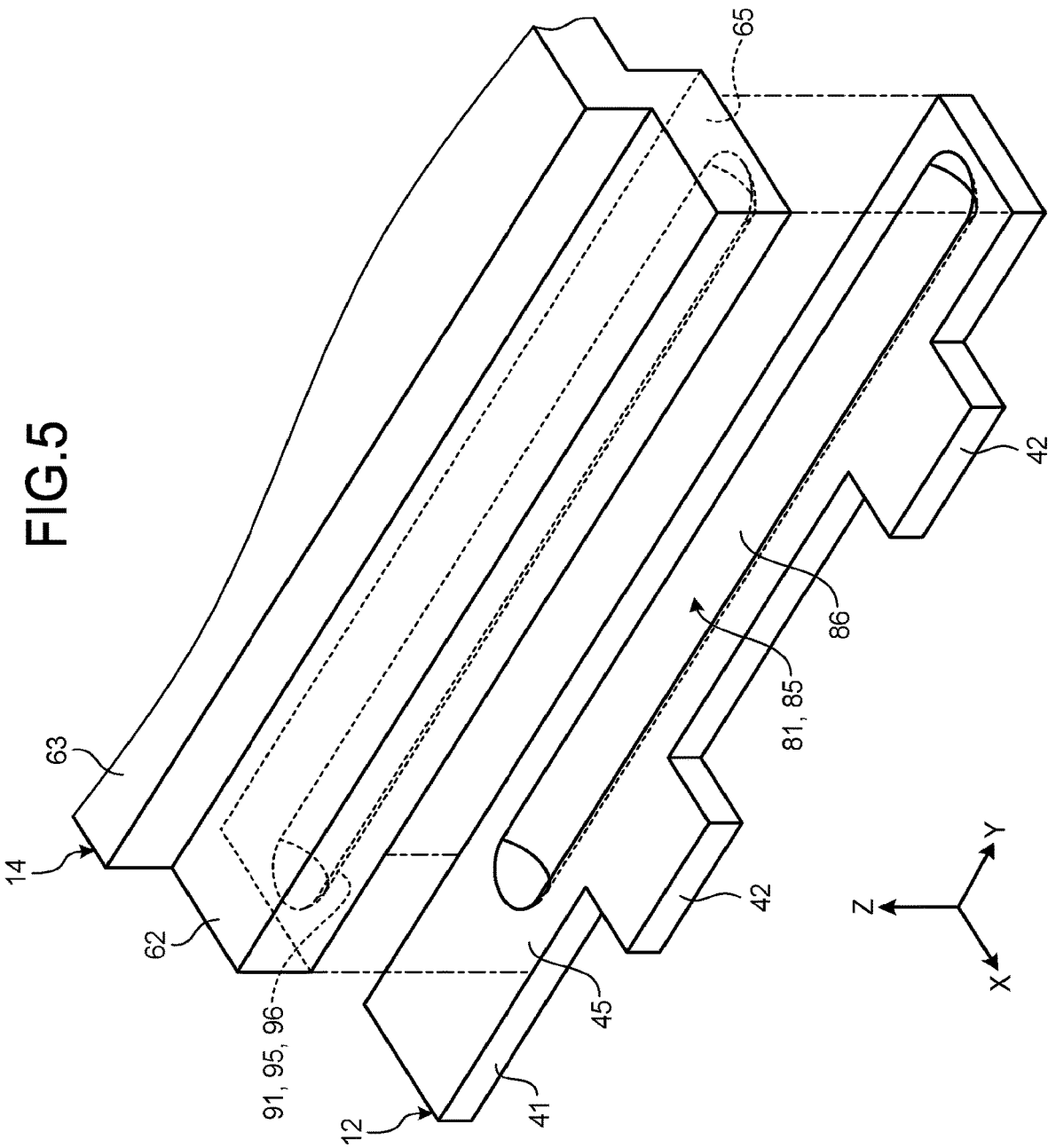
FIG. 5 is an exemplary schematic perspective view of the second leadframe and the part of the first connector of the first embodiment.

FIG. 5 is an exemplary schematic perspective view of the second leadframe 12 and the part of the first connector 14 of the first embodiment. As illustrated in FIG. 5, the fourth connecting face 65 extends in the Y direction. The length of the fourth connecting face 65 in the Y direction is longer than the length thereof in the X direction.

The fourth connecting face 65 faces the second connecting face 45 of the second leadframe 12. In the Y direction, the second connecting face 45 is longer than the fourth connecting face 65. The second connecting face 45 and the fourth connecting face 65 are not limited to these examples.

As illustrated in FIG. 4, solder 68 is spread between the second connecting face 45 and the fourth connecting face 65. The solder 68 is an exemplary conductive adhesive. The solder 68 is lead-containing solder or lead-free solder. The conductive adhesive is not limited to the solder 68 and may be silver paste or solder, for example.

The solder 68 works to mechanically and electrically connect the fourth connecting face 65 of the first connector 14 to the second connecting face 45 of the second leadframe 12. Thus, the first connector 14 electrically connects the second electrode 26 of the semiconductor chip 10 and the second leadframe 12 to each other.

As illustrated in FIG. 2, the second connector 15 has a third connecting part 71, a fourth connecting part 72, and an intermediate part 73. The intermediate part 73 connects the third connecting part 71 and the fourth connecting part 72 to each other.

The third connecting part 71 is disposed on the third electrode 27 of the semiconductor chip 10. The third connecting part 71 is mechanically and electrically connected to the third electrode 27 of the semiconductor chip 10 with a conductive adhesive such as solder.

FIG. 4 can schematically illustrate the third leadframe 13 and part of the second connector 15 of the first embodiment. As illustrated in FIG. 4, the fourth connecting part 72 has a fifth connecting face 75. The fifth connecting face 75 can be an exemplary second face. The fifth connecting face 75 is a substantially rectangular (quadrangular) substantially flat face directed in the −Z direction.

The fourth connecting part 72 has a substantially rectangular (quadrangular) plate shape lying in the X-Y plane. The fourth connecting part 72 extends in the Y direction. Thus, the fifth connecting face 75 also extends in the Y direction. The fifth connecting face 75 faces the third connecting face 55 of the third leadframe 13.

Solder 78 is interposed between the third connecting face 55 and the fifth connecting face 75. The solder 78 can be an exemplary conductive adhesive. The solder 78 mechanically and electrically connects the fifth connecting face 75 of the second connector 15 to the third connecting face 55 of the third leadframe 13. Thus, the second connector 15 electrically connects the third electrode 27 of the semiconductor chip 10 and the third leadframe 13 to each other.

As illustrated in FIG. 3, the sealing resin 16 covers the semiconductor chip 10, the die pad 31 of the first leadframe 11, the inner lead 41 of the second leadframe 12, the inner lead 51 of the third leadframe 13, the first connector 14, and the second connector 15. The leads 32 of the first leadframe 11, the outer leads 42 of the second leadframe 12, and the outer lead 52 of the third leadframe 13 are positioned outside the sealing resin 16 and are used as terminals of the semiconductor device 1.

The leads 32 of the first leadframe 11, the outer leads 42 of the second leadframe 12, and the outer lead 52 of the third leadframe 13 are connected to a pad of a circuit board with solder, for example. Thus, the semiconductor device 1 is mounted on the circuit board.

As illustrated in FIG. 4, the second connecting face 45 of the second leadframe 12 is provided with a recess 81. In the present embodiment, the recess 81 includes a groove 85. The recess 81 and the groove 85 are each an exemplary recess. The recess 81 may include a plurality of grooves 85 and/or another recess. The recess 81 may include a recess such as a hole, a slit, or a cutout, for example.

The groove 85 is a part recessed from the second connecting face 45. The second connecting face 45 includes a concave face 86 that is recessed from the other part of the second connecting face 45 and forms (defines) the groove 85. The groove 85 and the concave face 86 are formed by press working, for example. The groove 85 and the concave face 86 may be formed by another method such as cutting.

Figure 6:
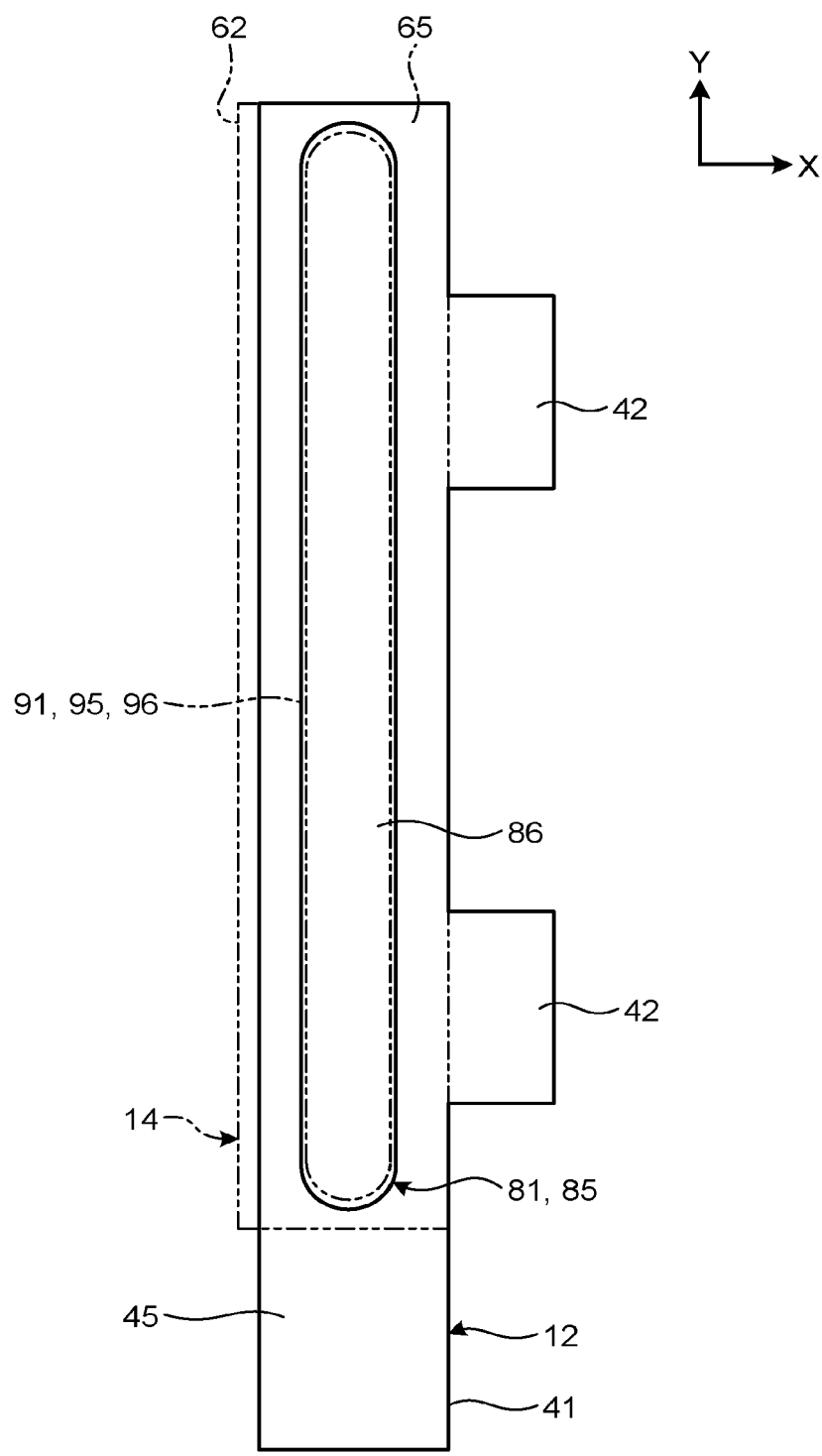
FIG. 6 is an exemplary schematic plan view of a second connecting face and a fourth connecting face of the first embodiment.

FIG. 6 is an exemplary schematic plan view of the second connecting face 45 and the fourth connecting face 65 of the first embodiment. FIG. 6 illustrates the fourth connecting face 65 in an imaginary manner with two-dotted chain lines. As illustrated in FIG. 6, the groove 85 extends in the Y direction. The groove 85 may extend in a direction inclined relative to the Y direction.

The groove 85 is longer in length in the Y direction (the longitudinal direction) than in the X direction (a transverse direction). The X direction is a direction along the second connecting face 45 and orthogonal to the Y direction, and is an exemplary second direction.

In the Y direction, the groove 85 is shorter in length than the second connecting face 45. The groove 85 is separated from both ends of the second connecting face 45 in the Y direction. The groove 85 may extend from one end of the second connecting face 45 to the other end thereof in the Y direction.

As illustrated in FIG. 4, the groove 85 has a substantially semicircular section as a section orthogonal to the Y direction. The concave face 86 is a substantially semicylindrical curved face. The groove 85 and the concave face 86 are not limited to these examples. The groove 85 may have a section with a substantially triangular, a substantially quadrangular, a substantially trapezoidal, or another shape, for example.

The first connector 14 has a protrusion 91. The protrusion 91 includes a projection 95. The protrusion 91 and the projection 95 are each an exemplary protrusion. The protrusion 91 may include a plurality of projections 95 and/or another protrusion. The protrusion 91 may include a protrusion such as a projecting part or a rib, for example.

The projection 95 is located on the fourth connecting face 65 of the first connector 14, protruding from the fourth connecting face 65. The fourth connecting face 65 includes a convex face 96. The convex face 96 projects from the other part of the fourth connecting face 65 to form an outer face (a surface) of the projection 95. The projection 95 and the convex face 96 are formed by press working, for example. The projection 95 and the convex face 96 may be formed by another method such as cutting.

As indicated by the two-dotted chain lines in FIG. 6, the projection 95 extends in the Y direction. The projection 95 may extend in a direction inclined relative to the Y direction. The projection 95 is longer in length in the Y direction (the longitudinal direction) than in the X direction (the transverse direction).

In the Y direction, the projection 95 is shorter in length than the fourth connecting face 65. The projection 95 is separated from both ends of the fourth connecting face 65 in the Y direction. The projection 95 may extend from one end of the fourth connecting face 65 to the other end thereof in the Y direction.

As illustrated in FIG. 4, the projection 95 has a substantially semicircular section as a section orthogonal to the Y direction. The convex face 96 is a substantially semicylindrical curved face. The projection 95 and the convex face 96 are not limited to these examples. The projection 95 may have a section with a substantially triangular, a substantially quadrangular, a substantially trapezoidal, or another shape, for example.

The radius of the section of the projection 95 is smaller than the radius of the section of the groove 85. That is to say, the groove 85 and the projection 95 have sectional shapes geometrically similar to each other. The section of the groove 85 is larger than the section of the projection 95. The groove 85 and the projection 95 are not limited to these examples and may have different shapes and/or the same size.

As illustrated in FIG. 6, in the Y direction, the projection 95 is shorter in length than the groove 85. The difference in length between the projection 95 and the groove 85 in the Y direction is larger than in the X direction, for example. The dimensions of the projection 95 and the groove 85 are not limited to this example.

As illustrated in FIG. 4, the projection 95 is housed in the groove 85 at least partially. In other expressions, the projection 95 fits into the groove 85. The solder 68 is interposed between the concave face 86 forming the groove 85 and the convex face 96 forming the projection 95.

The following exemplifies part of a method for manufacturing the semiconductor device 1. The method for manufacturing the semiconductor device 1 is not limited to the following method, and another method maybe used. First, solder paste is applied to the first electrode 25 of the semiconductor chip 10 or the first connecting face 35 of the first leadframe 11. The semiconductor chip 10 is disposed on the first leadframe 11 such that the solder paste is interposed between the first electrode 25 and the first connecting face 35.

Next, solder paste is applied to the second electrode 26 of the semiconductor chip 10 or the first connecting part 61 of the first connector 14. Further, solder paste (the solder 68) is applied to the second connecting face 45 of the second leadframe 12 or the fourth connecting face 65 of the first connector 14.

The solder paste (the solder 68) may be applied to the concave face 86 or the other part of the second connecting face 45. The solder paste may be applied to the convex face 96 or the other part of the fourth connecting face 65.

The first connector 14 is disposed on the semiconductor chip 10 such that the solder paste is interposed between the second electrode 26 and the first connecting part 61. At the same time, the first connector 14 is disposed on the second leadframe 12 such that the solder paste (the solder 68) is interposed between the second connecting face 45 and the fourth connecting face 65.

Next, solder paste is applied to the third electrode 27 of the semiconductor chip 10 or the third connecting part 71 of the second connector 15. Further, solder paste (the solder 78) is applied to the third connecting face 55 of the third leadframe 13 or the fifth connecting face 75 of the second connector 15.

The second connector 15 is disposed on the semiconductor chip 10 such that the solder paste is interposed between the third electrode 27 and the third connecting part 71. At the same time, the second connector 15 is disposed on the third leadframe 13 such that the solder paste (the solder 78) is interposed between the third connecting face 55 and the fifth connecting face 75.

Next, the solder paste is melted and solidified by reflow. The reflowed solder connects the first electrode 25 and the first connecting face 35 to each other, connects the second electrode 26 and the first connecting part 61 to each other, and connects the third electrode 27 and the second connector 15 to each other. The reflowed solder 78 connects the third connecting face 55 and the fifth connecting face 75 to each other.

The solder 68 melted by reflow flows between the second connecting face 45 and the fourth connecting face 65. The solder 68 adheres to the concave face 86 and the convex face 96 through surface tension and also adheres to the other part of the second connecting face 45 and the other part of the fourth connecting face 65.

The solder 68 is melted, whereby the second leadframe 12 and the first connector 14 can mutually relatively move. The first connector 14 moves relative to the second leadframe 12 such that the distance between the second connecting face 45 and the fourth connecting face 65 is substantially uniform, for example. Further, the first connector 14 moves relative to the second leadframe 12, whereby the projection 95 fits into the groove 85.

By the surface tension of the melted solder 68, the first connector 14 is moved such that the second connecting face 45 and the fourth connecting face 65 extend substantially in parallel with each other. By the surface tension of the melted solder 68, the projection 95 is moved so as to extend substantially in parallel with the groove 85. Further, by the surface tension of the melted solder 68, the projection 95 is moved to substantially the center of the groove 85. In other words, the projection 95 is moved such that the distance between the convex face 96 and the concave face 86 is substantially uniform.

The first connector 14 is moved to a desired position relative to the second leadframe 12 with the surface tension of the melted solder 68. The desired position can be set by the shape of the second connecting face 45 and the fourth connecting face 65 and the position and shape of the recess 81 and the protrusion 91, for example. Thus, the surface tension of the melted solder 68 works to align the second leadframe 12 and the first connector 14.

The melted solder 68 moves the first connector 14 in the X direction, the Y direction, the Z direction, and a rotational direction about a rotation axis parallel with the Z axis relative to the second leadframe 12 to perform alignment, for example. When the first connector 14 is inclined about the rotation axis parallel with the Z axis relative to the second leadframe 12, for example, the surface tension of the melted solder 68 rotates the first connector 14 about the rotation axis relative to the second leadframe 12. Thus, the first connector 14 is moved to the desired position relative to the second leadframe 12.

The melted solder 68 moves the first connector 14 to reduce (correct) the displacement of the first connector 14 from the desired position relative to the second leadframe 12. After reflow, the relative position of the second leadframe 12 and the first connector 14 may be slightly displaced from the desired position.

After a plurality of pieces of solder including the solder 68 and 78 are reflowed, the semiconductor chip 10, the first leadframe 11, the second leadframe 12, part of the third leadframe 13, the first connector 14, and the second connector 15 are sealed by the sealing resin 16. Thus, the semiconductor device 1 is manufactured.

In the semiconductor device 1 according to the first embodiment described in the foregoing, the first connector 14 includes the fourth connecting face 65 provided with the protrusion 91. The fourth connecting face 65 is connected to the second connecting face 45 of the second leadframe 12 with the solder 68. The protrusion 91 is at least partially housed in the recess 81 of the second connecting face 45. Due to melting of the solder 68, typically, the first connector 14 may become movable relative to the second leadframe 12 and be displaced from a desired position. However, in the present embodiment, when the solder 68 melts, the protrusion 91 fits into the recess 81. This makes it possible to prevent the first connector 14 from being displaced from the desired position relative to the second leadframe 12. That is to say, the semiconductor device 1 can be avoided from degrading in quality, which would otherwise occur due to the melting of the solder 68.

Typically, the solder 68 may be broken by occurrence of a crack in the entire transverse (X-directional) area. In the present embodiment, the recess 81 and the protrusion 91 are longer in length in the Y direction (a direction in which the second connecting face 45 extends; or the longitudinal direction) than in the X direction (a direction along the second connecting face 45 and orthogonal to the Y direction; or the transverse direction). In other words, the recess 81 and the protrusion 91 generally extend in the longitudinal direction. This results in increasing the lengths of the second connecting face 45 and the fourth connecting face 65 between both transverse ends by the recess (the concave face 86) and the protrusion 91 (the convex face 96). That is to say, as illustrated in FIG. 4, the solder 68, connecting the second connecting face 45 and the fourth connecting face 65 to each other, is increased in the length L between both transverse ends. Consequently, the solder 68 is less likely to be broken by a transverse crack. Thus, the semiconductor device 1 can be avoided from degrading in quality, which would otherwise occur by the breakage of the solder 68.

During reflow, the second leadframe 12 is typically disposed with the second connecting face 45 facing upward. Thus, the melted solder 68 can accumulate inside the recess 81 and is prevented from flowing out of the second connecting face 45.

The recess 81 and the protrusion 91 have sectional shapes similar to each other. The section of the recess 81 is larger than the section of the protrusion 91. Thus, the thickness of the solder 68 between the recess 81 and the protrusion 91 is substantially constant, and the position of the first connector 14 relative to the second leadframe 12, which is set by surface tension, is easily made constant. Consequently, the first connector 14 is prevented from being displaced from the desired position relative to the second leadframe 12.

The recess 81 and the protrusion 91 extend in the Y direction. Thus, the recess 81 and the protrusion 91 can be set to a longer length. The melted solder 68 on the recess 81 and the protrusion 91 having longer lengths serves to easily correct the inclination of the first connector 14 relative to the second leadframe 12. Consequently, the first connector 14 is prevented from being displaced from the desired position relative to the second leadframe 12.

The recess 81 is separated from both ends of the second connecting face 45 in the Y direction. Thus, the melted solder 68 is inhibited from flowing out of the edges of the second connecting face 45 in the longitudinal direction.

In the Y direction, the length of the protrusion 91 is shorter than the length of the recess 81. Thus, when the solder 68 melts, the protrusion 91 easily fits into the recess 81. Consequently, the first connector 14 is prevented from being displaced from the desired position relative to the second leadframe 12.

Second Embodiment

Figure 7:
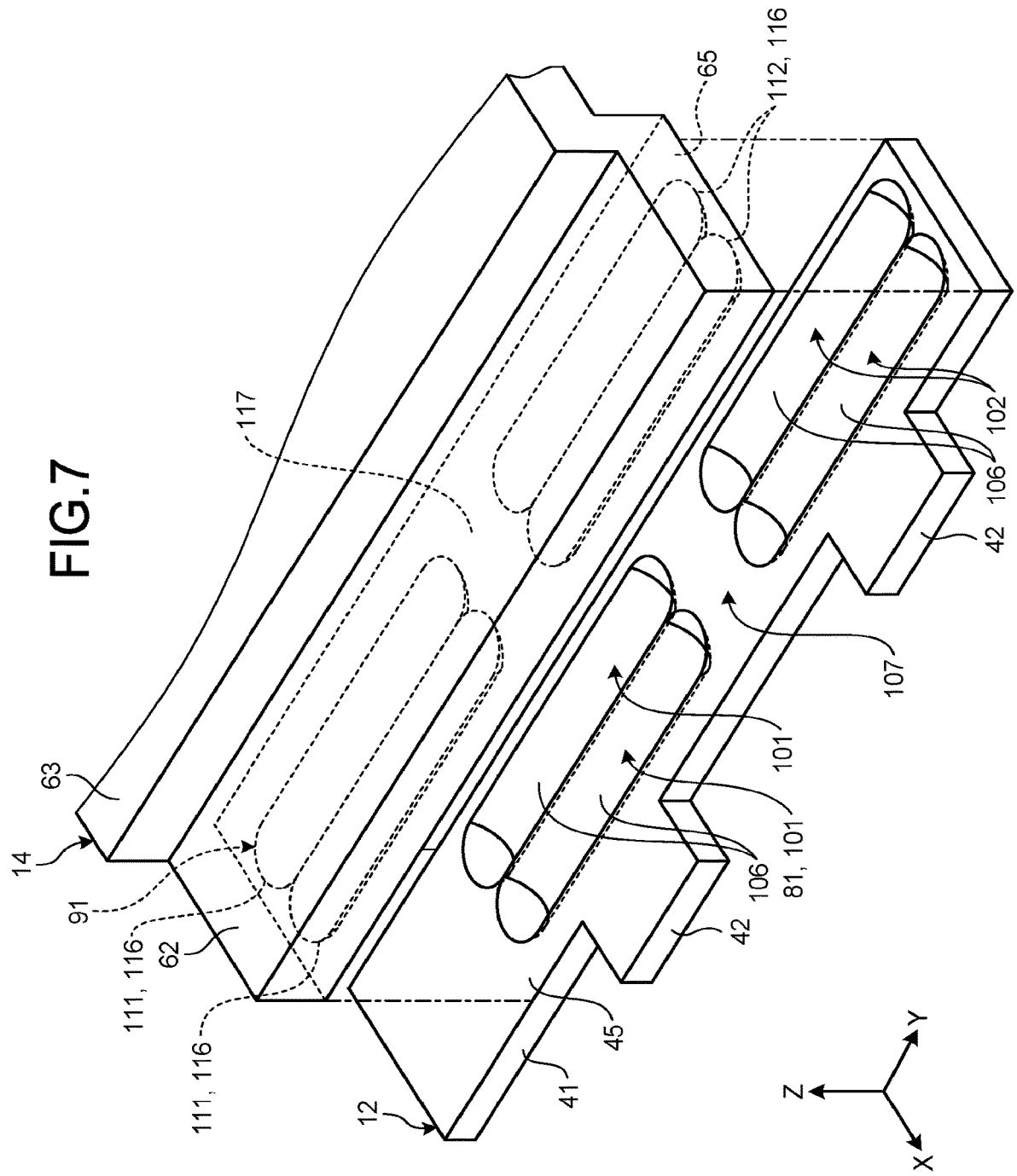
FIG. 7 is an exemplary schematic perspective view of the second leadframe and part of the first connector according to a second embodiment.
Figure 8:
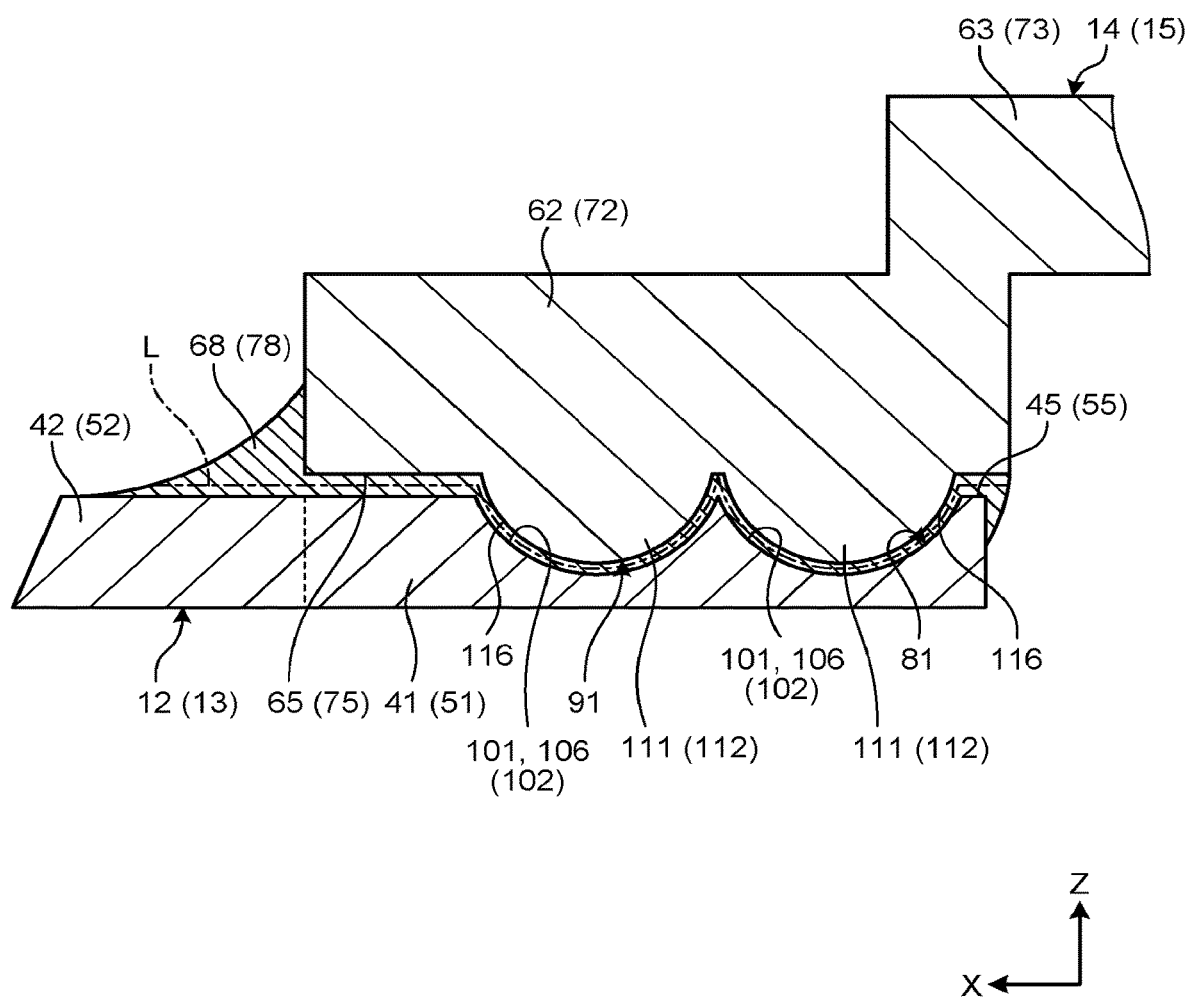
FIG. 8 is an exemplary schematic sectional view of the second leadframe and the part of the first connector of the second embodiment.
Figure 9:
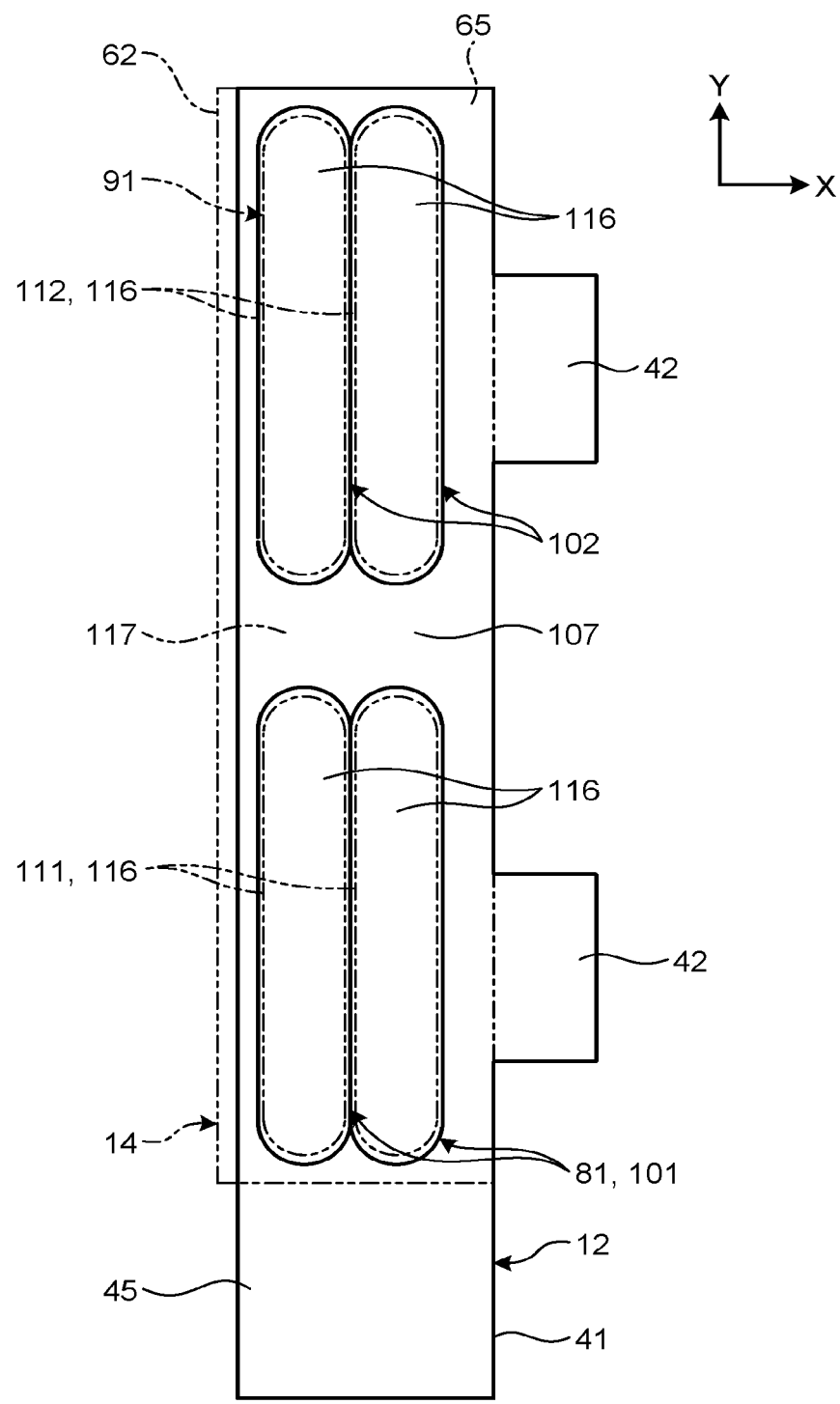
FIG. 9 is an exemplary schematic plan view of the second connecting face and the fourth connecting face of the second embodiment.

The following describes a second embodiment with reference to FIG. 7 to FIG. 9. In the description of the following embodiment, components having functions similar to those of the components that have already been described are denoted by the same symbols as those of the components that have already been described, and descriptions thereof may be omitted. A plurality of components denoted by the same symbol are not necessarily common regarding all the functions and properties and may have different functions and properties according to the respective embodiments.

FIG. 7 is an exemplary schematic perspective view of the second leadframe 12 and part of the first connector 14 according to the second embodiment. FIG. 8 is an exemplary schematic sectional view of the second leadframe 12 and the part of the first connector 14 of the second embodiment. FIG. 9 is an exemplary schematic plan view of the second connecting face 45 and the fourth connecting face 65 of the second embodiment.

As illustrated in FIG. 7, the recess 81 of the second embodiment includes a plurality of first grooves 101 and a plurality of second grooves 102. The recess 81, the first grooves 101, and the second grooves 102 are each an exemplary recess.

The first grooves 101 and the second grooves 102 are parts recessed from the second connecting face 45. The second connecting face 45 includes a plurality of concave faces 106. The concave faces 106 are recessed from the other part of the second connecting face 45 to form (define) the corresponding first grooves 101 or second grooves 102.

The first grooves 101, second grooves 102, and the concave faces 106 are formed by press working, for example. The first grooves 101, second grooves 102, and the concave faces 106 may be formed by another method such as cutting.

The first grooves 101 and the second grooves 102 each extend in the Y direction. The first grooves 101 and the second grooves 102 may each extend in a direction inclined relative to the Y direction. The length of each of the first grooves 101 and the second grooves 102 in the Y direction (the longitudinal direction) is longer than the length thereof in the X direction (the transverse direction).

In the Y direction, the first grooves 101 and the second grooves 102 are each shorter than the second connecting face 45. The first grooves 101 and the second grooves 102 are separated from both ends of the second connecting face 45 in the Y direction. At least either the first grooves 101 or the second grooves 102 may extend from at least either one end or the other end of the second connecting face 45 in the Y direction.

As illustrated in FIG. 8, the first grooves 101 and the second grooves 102 each have a semicircular section as a section orthogonal to the Y direction. The first grooves 101 and the second grooves 102 have sections with substantially the same shape. The concave faces 106 are each a substantially semicylindrical curved face. The first grooves 101, the second grooves 102, and the concave faces 106 are not limited to these examples. The first grooves 101 and the second grooves 102 may have sections with different shapes, for example.

The first grooves 101 are juxtaposed to each other in the X direction. The second grooves 102 are also juxtaposed to each other in the X direction. As illustrated in FIG. 7, the first grooves 101 and the second grooves 102 are spaced apart from each other in the Y direction. Thus, there is an intermediate face 107 between the first grooves 101 and the second grooves 102 in the Y direction. The intermediate face 107 is part of the second connecting face 45 and is a substantially flat part directed in the +Z direction.

The protrusion 91 of the second embodiment includes a plurality of first protrusions 111 and a plurality of second protrusions 112. The protrusion 91, the first protrusions 111, and the second protrusions 112 are each an exemplary protrusion.

The first protrusions 111 and the second protrusions 112 are each provided on the fourth connecting face 65 of the first connector 14 and protrude from the fourth connecting face 65. The fourth connecting face 65 includes convex faces 116. The convex faces 116 project from the other part of the fourth connecting face 65 to form outer faces (surfaces) of the corresponding first protrusions 111 or second protrusions 112.

The first protrusions 111, the second protrusions 112, and the convex faces 116 are formed by press working, for example. The first protrusions 111, the second protrusions 112, and the convex faces 116 may be formed by another method such as cutting.

As indicated by the two-dotted chain lines in FIG. 9, the first protrusions 111 and the second protrusions 112 each extend in the Y direction. The first protrusions 111 and the second protrusions 112 may each extend in a direction inclined relative to the Y direction. The length of each of the first protrusions 111 and the second protrusions 112 in the Y direction (the longitudinal direction) is longer than the length thereof in the X direction (the transverse direction).

In the Y direction, the first protrusions 111 and the second protrusions 112 are each shorter than the fourth connecting face 65. The first protrusions 111 and the second protrusions 112 are separated from both ends of the fourth connecting face 65 in the Y direction. At least either the first protrusions 111 or the second protrusions 112 may extend from at least either one end or the other end of the fourth connecting face 65 in the Y direction.

As illustrated in FIG. 8, the first protrusions 111 and the second protrusions 112 each have a semicircular section as a section orthogonal to the Y direction. The first protrusions 111 and the second protrusions 112 have sections with substantially the same shape. The convex faces 116 are each a substantially semicylindrical curved face. The first protrusions 111, the second protrusions 112, and the convex faces 116 are not limited to these examples. The first protrusions 111 and the second protrusions 112 may have sections with different shapes, for example.

The first protrusions 111 are juxtaposed to each other in the X direction. The second protrusions 112 are also juxtaposed to each other in the X direction. As Illustrated in FIG. 7, the first protrusions 111 and the second protrusions 112 are spaced apart from each other in the Y direction. Thus, there is an intermediate face 117 between the first protrusions 111 and the second protrusions 112 in the Y direction. The intermediate face 117 is part of the fourth connecting face 65 and is a substantially flat part directed in the −Z direction.

As illustrated in FIG. 8, the radius of the section of the first protrusions 111 is smaller than the radius of the section of the first grooves 101. That is to say, the first grooves 101 and the first protrusions 111 have sectional shapes similar to each other. The section of the first grooves 101 is larger than the section of the first protrusions 111. The first grooves 101 and the first protrusions 111 are not limited to these examples and may have different shapes and/or the same size. Similarly, the second grooves 102 and the second protrusions 112 also have sectional shapes similar to each other. The section of the second grooves 102 is larger than the section of the second protrusions 112.

As illustrated in FIG. 9, in the Y direction, the length of the first protrusions 111 is shorter than the length of the first grooves 101. In the Y direction, the length of the second protrusions 112 is shorter than the length of the second grooves 102. The dimensions of the first grooves 101, the second grooves 102, the first protrusions 111, and the second protrusions 112 are not limited to these examples.

As illustrated in FIG. 8, the first protrusions 111 are housed in the respective corresponding first grooves 101 at least partially. The second protrusions 112 are housed in the respective corresponding second grooves 102 at least partially. In other expressions, the first protrusions 111 and the second protrusions 112 fit into the corresponding first grooves 101 and second grooves 102, respectively. The solder 68 is interposed between the concave faces 106 forming the first grooves 101 or the second grooves 102 and the convex faces 116 forming the first protrusions 111 or the second protrusions 112.

In the semiconductor device 1 of the second embodiment described in the foregoing, the first grooves 101 and the first protrusions 111 are juxtaposed to each other in the X direction (the transverse direction). Thus, the length of the second connecting face 45 and the fourth connecting face 65 between both ends in the transverse direction further increases by the first grooves 101 (the concave faces 106) and the first protrusions 111 (the convex faces 116). That is to say, as illustrated in FIG. 8, the length L of the solder 68 connecting the second connecting face 45 and the fourth connecting face 65 to each other between both ends in the transverse direction increases. Consequently, the solder 68 is prevented from being broken by a transverse crack.

The first grooves 101 and the second grooves 102 are separated apart from each other in the Y direction (the longitudinal direction). Furthermore, the first protrusions 111 and the second protrusions 112 are separated apart from each other in the longitudinal direction. Thus, the melted solder 68 can flow between the intermediate face 107 of the second leadframe 12 and the intermediate face 117 of the first connector 14. Consequently, the solder 68, passing through between the intermediate face 107 and 117, can uniformly spread to inhibit the solder 68 from being unevenly distributed in the transverse direction.

In the foregoing embodiments, the recess 81 may be provided not only in the second leadframe 12 but also in the third connecting face 55 of the third leadframe 13. Further, not only the first connector 14, but also the second connector 15 may have the protrusion 91. In this case, the foregoing descriptions about the recess 81 and the protrusion 91 can describe the recess 81 of the third leadframe 13 and the protrusion 91 of the second connector 15 by reading the second leadframe 12, the first connector 14, the second connecting face 45, the fourth connecting face 65, and the solder 68 as the third leadframe 13, the second connector 15, the third connecting face 55, the fifth connecting face 75, and the solder 78.

According to at least one embodiment described in the foregoing, the conductive member has a second face and electrically connects the semiconductor chip and the second leadframe to each other. The second face is connected to the first face with a conductive adhesive and is provided with a protrusion at least partially housed in the recess. Thus, when the conductive adhesive melts, the protrusion fits into the recess, and thus the conductive member is prevented from being displaced from the desired position relative to the second leadframe. In general, when a crack occurs in the entire area of the conductive adhesive in the transverse direction, breakage may occur in the conductive adhesive. In the present embodiment, the recess and the protrusion is longer in length in the first direction in which the first face extends (the longitudinal direction) than in the second direction along the first face and orthogonal to the first direction (the transverse direction). In other words, the recess and the protrusion generally extend in the longitudinal direction. Thus, the length of the first face and the second face between both ends in the transverse direction increases by the recess and the protrusion. That is to say, the conductive adhesive, connecting the first face and the second face to each other, is increased in length between both transverse ends. Consequently, the conductive adhesive is prevented from being broken by a transverse crack.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first leadframe;
   a second leadframe, which is spaced apart from the first leadframe, has a first face, and is provided with a recess, the recess opening on the first face;
   a semiconductor chip mounted on the first leadframe; and
   a conductive member having a second face and a protrusion, the conductive member being configured to electrically connect the semiconductor chip and the second leadframe to each other, the second face being connected to the first face with a conductive adhesive, the protrusion projecting from the second face and being at least partially housed in the recess, the protrusion being connected to an inner face of the recess with the conductive adhesive, wherein
   the recess is longer in length in a first direction in which the first face extends than in a second direction along the first face and orthogonal to the first direction,
   the protrusion is longer in length in the first direction than in the second direction,
   a cross-section of the recess orthogonal to the first direction is geometrically similar to a cross-section of the protrusion orthogonal to the first direction, and
   the cross-section of the recess is larger than the cross-section of the protrusion.

2. The semiconductor device according to claim 1, wherein
   the recess extends in the first direction, and
   the protrusion extends in the first direction.

3. The semiconductor device according to claim 1, wherein
   the recess is spaced apart from both ends of the first face in the first direction.

4. The semiconductor device according to claim 1, wherein
   the protrusion is shorter in length than the recess in the first direction.

5. The semiconductor device according to claim 1, wherein
   the recess includes a plurality of recesses,
   the protrusion includes a plurality of protrusions,
   the first face is provided with the plurality of recesses juxtaposed to each other in the second direction, and
   the second face is provided with the plurality of protrusions, the protrusions juxtaposed to each other in the second direction, and at least partially housed in the recesses.

6. The semiconductor device according to claim 1, wherein
   the recess includes a plurality of recesses,
   the protrusion includes a plurality of protrusions,
   the first face is provided with the plurality of recesses spaced apart from each other in the first direction, and the second face is provided with the plurality of protrusions, the protrusions spaced apart from each other in the first direction, and at least partially housed in the recesses.

7. The semiconductor device according to claim 1, wherein the protrusion is spaced apart from an outer edge of the second face.

8. The semiconductor device according to claim 1, wherein the recess and the protrusion each have a semicircular cross-section as the cross-section orthogonal to the first direction.

\* \* \* \* \*